United States Patent
Kikuchi (10) Patent No.: US 11,107,898 B2
(45) Date of Patent: Aug. 31, 2021

(54) SEMICONDUCTOR DEVICE AND METHOD FOR MANUFACTURING SAME

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventor: Takuo Kikuchi, Kamakura (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 34 days.

(21) Appl. No.: 16/795,688

(22) Filed: Feb. 20, 2020

(65) Prior Publication Data
US 2020/0303510 A1   Sep. 24, 2020

(30) Foreign Application Priority Data

Mar. 19, 2019 (JP) .............................. JP2019-051159

(51) Int. Cl.
*H01L 29/423* (2006.01)
*H01L 21/02* (2006.01)
(Continued)

(52) U.S. Cl.
CPC .... *H01L 29/4236* (2013.01); *H01L 21/02126* (2013.01); *H01L 29/0649* (2013.01);
(Continued)

(58) Field of Classification Search
CPC . H01L 29/407; H01L 29/511; H01L 29/0649; H01L 29/7813; H01L 29/4236
See application file for complete search history.

(56) References Cited

U.S. PATENT DOCUMENTS

| 2010/0191641 A1 | 7/2010 | Blank |
| 2014/0284773 A1* | 9/2014 | Nishiguchi ......... H01L 29/7813 257/637 |

(Continued)

FOREIGN PATENT DOCUMENTS

| JP | 2017-522719 A | 8/2017 |
| JP | 2017-162909 A | 9/2017 |

*Primary Examiner* — Joseph C. Nicely
(74) *Attorney, Agent, or Firm* — Oblon, McClelland, Maier & Neustadt, L.L.P.

(57) ABSTRACT

A semiconductor device includes a semiconductor part, first and second electrodes on back and front surfaces of the semiconductor part, respectively, a control electrode and a field plate inside a trench on the front surface side. The semiconductor part includes first and third layers of a first conductivity type and a second layer of a second conductivity type. The second layer is provided between the first layer and the second electrode. The third layer is selectively provided between the second layer and the second electrode. The field plate is electrically isolated from the semiconductor part by first and second insulating films. The control electrode is electrically isolated from the semiconductor part by the first insulating film. The second insulating film positioned between the first insulating film and the field plate. The second insulating film has a dielectric constant smaller than a dielectric constant of the first insulating film.

15 Claims, 8 Drawing Sheets

(51) Int. Cl.
  *H01L 29/40* (2006.01)
  *H01L 29/51* (2006.01)
  *H01L 29/78* (2006.01)
  *H01L 29/06* (2006.01)

(52) U.S. Cl.
  CPC .......... *H01L 29/407* (2013.01); *H01L 29/511* (2013.01); *H01L 29/7813* (2013.01)

(56) References Cited

U.S. PATENT DOCUMENTS

| | | | |
|---|---|---|---|
| 2014/0287574 A1* | 9/2014 | Takahashi | H01L 29/66734 438/586 |
| 2016/0079374 A1* | 3/2016 | Okumura | H01L 29/407 257/330 |
| 2016/0079375 A1* | 3/2016 | Yamazaki | H01L 29/4238 257/330 |
| 2016/0093719 A1* | 3/2016 | Kobayashi | H01L 29/66734 257/330 |
| 2017/0092726 A1 | 3/2017 | Nidhi et al. | |
| 2017/0263767 A1 | 9/2017 | Nishiwaki | |
| 2017/0365708 A1 | 12/2017 | Li et al. | |

* cited by examiner

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No. 2019-051159, filed on Mar. 19, 2019; the entire contents of which are incorporated herein by reference.

FIELD

Embodiments relate generally to a semiconductor device and a method for manufacturing the same.

BACKGROUND

There is a trench-gate type MOSFET categorized as one of semiconductor devices, which comprises a gate electrode and a field plate disposed inside the gate trench.

For example, it is preferable in MOSFET to widen the inversion channel by increasing the trench gate density to reduce the channel resistance. However, there may be a case where the on-resistance of MOSFET is increased due to the current flow path narrowed between the trench gates. Although such increase of the on-resistance can be avoided by increasing the impurity concentration in the drift layer, the breakdown voltage is reduced in the off state of MOSFET. Then, the field plate is provided in the trench gate to achieve the low on-resistance and the high breakdown voltage, but it makes the parasitic capacitance between drain and source electrodes increase.

BRIEF DESCRIPTION OF THE DRAWINGS

FIGS. 2A to 7B are schematic cross-sectional view showing manufacturing processes of the semiconductor device according to the embodiment.

DETAILED DESCRIPTION

According to one embodiment, a semiconductor device includes a semiconductor part including a first semiconductor layer of a first conductivity type; a first electrode provided on a back surface of the semiconductor part; a second electrode provided on a front surface of the semiconductor part; a control electrode provided between the second electrode and the semiconductor part, the control electrode being disposed inside a trench provided on the front surface side of the semiconductor part; and a field plate provided inside the trench. The field plate is located between the first electrode and the control electrode. The field plate is electrically isolated from the semiconductor part by first and second insulating films. The control electrode is electrically isolated from the semiconductor part by the first insulating film. The field plate is electrically isolated from the control electrode by a third insulating film. The semiconductor part further includes a second semiconductor layer of a second conductivity type and a third semiconductor layer of the first conductivity type. The second semiconductor layer is provided between the first semiconductor layer and the second electrode. The second semiconductor layer faces the control electrode with the first insulating film interposed. The third semiconductor layer is selectively provided between the second semiconductor layer and the second electrode. The first insulating film includes a portion positioned between the first semiconductor layer and the second insulating film. The second insulating film is positioned between the first insulating film and the field plate. The second insulating film has a dielectric constant smaller than a dielectric constant of the first insulating film.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1:
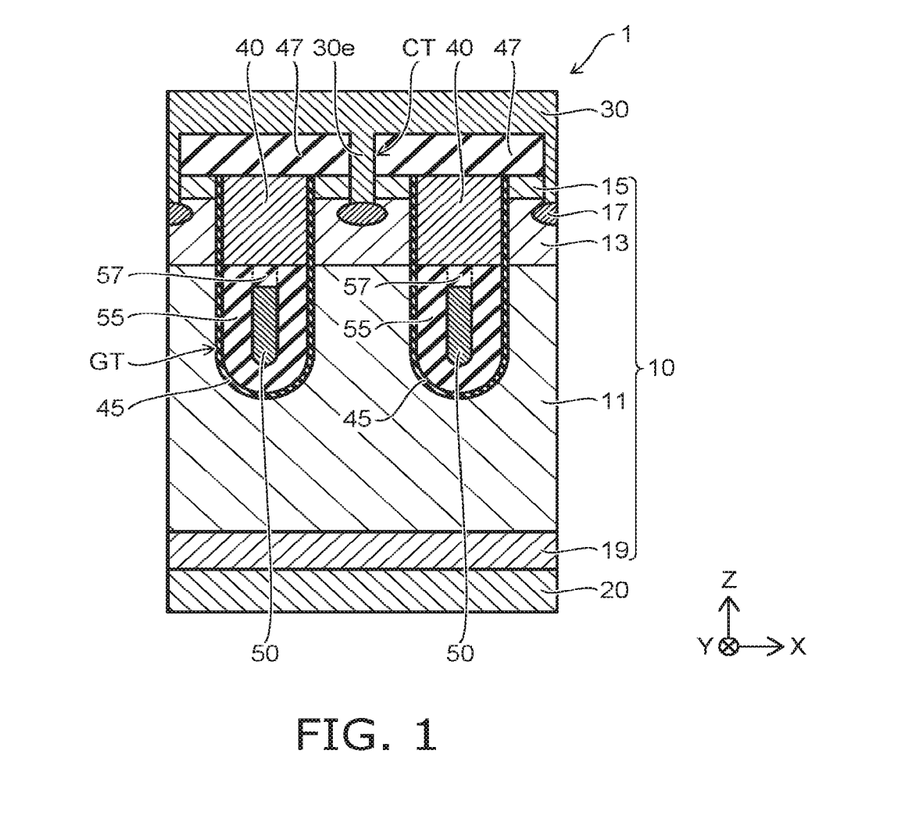
FIG. 1 is a schematic cross-sectional view showing a semiconductor device according to an embodiment.

FIG. 1 is a schematic cross-sectional view showing a semiconductor device 1 according to the embodiment. The semiconductor device 1 is a power MOSFET, for example. The semiconductor device 1 has a trench gate structure.

As shown in FIG. 1, the semiconductor device 1 includes a semiconductor part 10, a drain electrode 20, a source electrode 30, a gate electrode 40, and a field plate 50. The semiconductor part 10 is, for example, silicon. The drain electrode 20 is provided on the back surface of the semiconductor part 10. The source electrode 30 is provided on the semiconductor part 10 on the front surface side.

The gate electrode 40 is disposed between the semiconductor part 10 and the source electrode 30. The gate electrode 40 is disposed inside a gate trench GT that is provided on the front surface side of the semiconductor part 10. The gate electrode 40 is electrically insulated from the semiconductor part 10 by the insulating film 45. The gate electrode 40 is electrically insulated from the source electrode 30 by the interlayer insulating film 47.

The field plate 50 is disposed inside the gate trench GT. The field plate 50 is located between the drain electrode 20 and the gate electrode 40. The field plate 50 is electrically insulated from the semiconductor part 10 by an insulating film that has a laminated structure including the insulating film 45 and an insulating film 55. The insulating film 55 is positioned between the insulating film 45 and the field plate 50. The insulating film 55 has a dielectric constant lower than a dielectric constant of the insulating film 45. The field plate 50 is electrically insulated from the gate electrode 40 by an insulating film 57.

The insulating film 45 is provided such that a top end of the insulating film contacts the interlayer insulating film 47. The insulating films 55 and 57 each have the top end contacting the gate electrode 40. The top ends of the insulating films 55 and 57 are arranged along the bottom of the gate electrode 40.

As shown in FIG. 1, the semiconductor part 10 includes an n-type drift layer 11, a p-type diffusion layer 13, an n-type source layer 15, a p-type contact layer 17, and an n-type drain layer 19.

The p-type diffusion layer 13 is provided between the n-type drift layer 11 and the source electrode 30. The p-type diffusion layer 13 is provided so as to face the gate electrode 40 with the insulating film 45 interposed. That is, the insulating film 45 includes a portion positioned between the p-type diffusion layer 13 and the gate electrode 40. The portion of the insulating film 45 acts as a gate insulating film.

The n-type source layer 15 is selectively provided between the p-type diffusion layer 13 and the source electrode 30. The n-type source layer 15 includes n-type impurities with an impurity concentration higher than a concentration of n-type impurities in the n-type drift layer 11.

For example, the p-type contact layer 17 is selectively provided in the p-type diffusion layer 13. The p-type contact layer 17 includes p-type impurities with an impurity concentration higher than a concentration of p-type impurities in the p-type diffusion layer 13. The p-type contact layer 17 is provided so as to electrically connect the p-type diffusion layer 13 and the source electrode 30.

In the example, the source electrode 30 has a contact portion 30e extending into the contact trench CT. The contact trench CT has a depth capable of reaching the p-type diffusion layer 13 from the top surface of the interlayer insulating film 47. The contact portion 30e is provided to be in contact with the n-type source layer 15 and the p-type contact layer 17. The source electrode 30 is electrically connected to the n-type source layer 15 and the p-type contact layer 17 through the contact portion 30e.

The n-type drain layer 19 is provided between the n-type drift layer 11 and the drain electrode 20. The n-type drain layer 19 includes n-type impurities with an impurity concentration higher than the concentration of n-type impurities in the n-type drift layer 11. The drain electrode 20 is electrically connected to the n-type drain layer 19.

In the embodiment, the field plate 50 is located in the n-type drift layer 11. The field plate 50 is electrically connected to, for example, the source electrode 30 at the portion not shown. The field plate 50 is electrically insulated from n-type drift layer 11 by an insulating film that has a laminated structure including the insulating film 45 and the insulating film 55. The insulating film 55 has a dielectric constant lower than a dielectric constant of the insulating film 45. Thus, it is possible to reduce the drain/source capacitance, which is a parasitic capacitance between the drain electrode 20 and the source electrode 30.

The insulating film 45 is, for example, a silicon oxide film. The insulating film 55 is, for example, a so-called porous silicon oxide film that has an atomic density lower than an atomic density of silicon oxide included in the insulating film 45. Moreover, the insulating film 55 may include, for example, a low-k material such as silicon oxycarbide (SiOC).

The insulating film 55 includes, for example, a material that provides an image brighter than an image of the insulating film 45 when being measured using a transmission electron microscope (TEM).

Herein below, a manufacturing method of the semiconductor device 1 will be described with reference to FIGS. 2A to 7B. FIGS. 2A to 7B are schematic cross-sectional views sequentially showing the manufacturing processes of the semiconductor device 1 according to the embodiment.

Figure 2A:
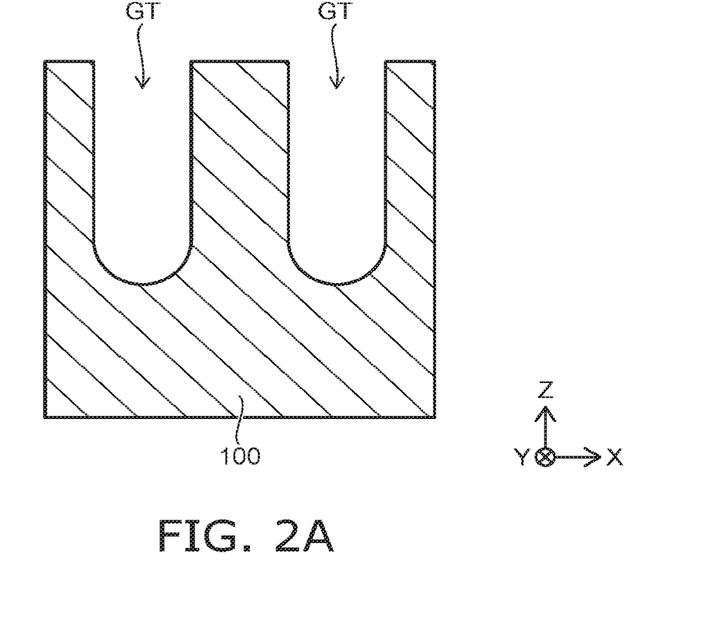

As shown in FIG. 2A, a gate trench GT is formed on the front surface side of the silicon wafer 100. The gate trench GT is formed by, for example, selectively removing the silicon wafer 100 using an etching mask (not shown). The etching is performed by RIE (Reactive Ion Etching). For example, the silicon wafer 100 includes n-type impurities with an impurity concentration same as the concentration of n-type impurities in the n-type drift layer 11.

Figure 2B:
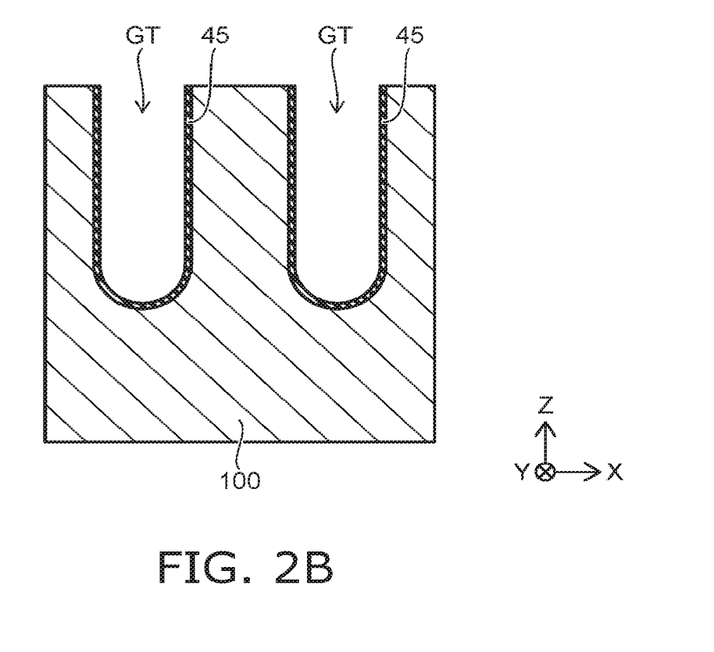

As shown in FIG. 2B, an insulating film 45 is formed to cover the inner surface of the gate trench GT. The insulating film 45 is, for example, a silicon oxide film. The insulating film is formed by, for example, thermal oxidization of the silicon wafer 100.

Figure 3A:
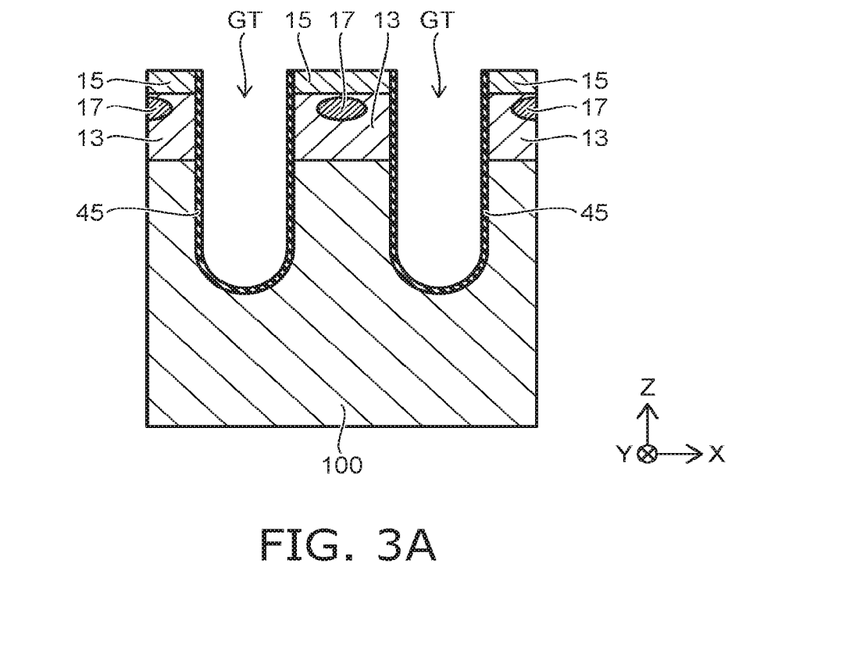

As shown in FIG. 3A, a p-type diffusion layer 13, an n-type source layer 15 and a p-type contact layer 17 are formed in the silicon wafer 100 on the front surface side thereof. For example, p-type impurities such as boron atoms (B) are ion-implanted into the silicon wafer 100 on the front surface side after the inside of the gate trench GT is filled with a sacrificial film (not shown). Subsequently, the p-type impurities ion-implanted are thermally diffused to form the p-type diffusion layer 13.

Further, n-type impurities such as phosphorus atoms (P) are ion-implanted into a region to be the n-type source layer 15. P-type impurities such as boron atoms (B) are selectively ion-implanted into other region to be the p-type contact layer 17. Thereafter, the n-type impurities and the p-type impurities are activated by heat treatment to form the n-type source layer 15 and the p-type contact layer 17. At this time, the heat treatment is performed for a short-time so that the p-type contact layer 17 has a bottom located at the position shallower than the bottom of the p-type diffusion layer 13. The p-type contact layer 17 is formed at a position deeper than a position of the n-type source layer 15 by ion implanting the p-type impurities under higher acceleration energy.

Figure 3B:
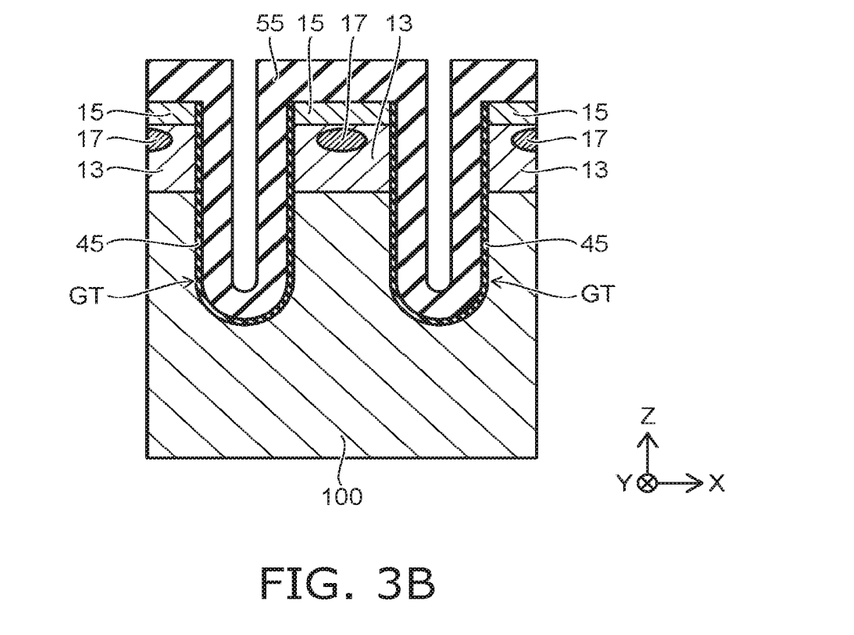

As shown in FIG. 3B, an insulating film 55 is formed inside the gate trench GT. The insulating film 55 is formed using, for example, CVD (Chemical Vapor Deposition) after selectively removing the sacrificial film (not shown). The insulating film 55 is formed on the insulating film 45 inside the gate trench GT. The insulating film 55 is formed so that a space remains inside the gate trench GT.

Figure 4A:
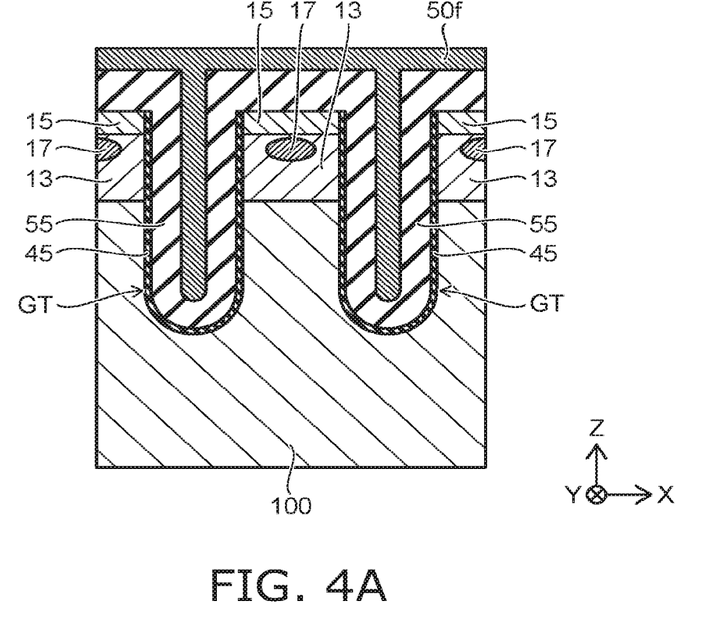

As shown in FIG. 4A, a conductive film 50f is formed so as to fill the space inside the gate trench GT. The conductive film 50f is, for example, a poly-silicon film that is formed using CVD.

Figure 4B:
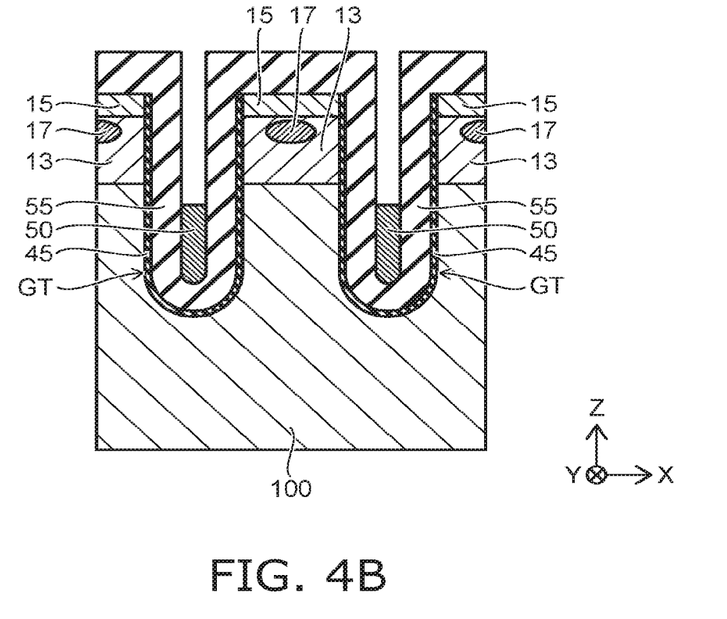

As shown in FIG. 4B, the field plate 50 is formed in a lower portion of the gate trench GT by etching back the conductive film 50f. For example, the field plate 50 is formed such that, in the depth direction (e.g., the Z direction), the top end thereof is located at a level lower than a level at which the bottom of the p-type diffusion layer 13 is located. The gate trench GT includes a space formed on the field plate 50.

Figure 5A:
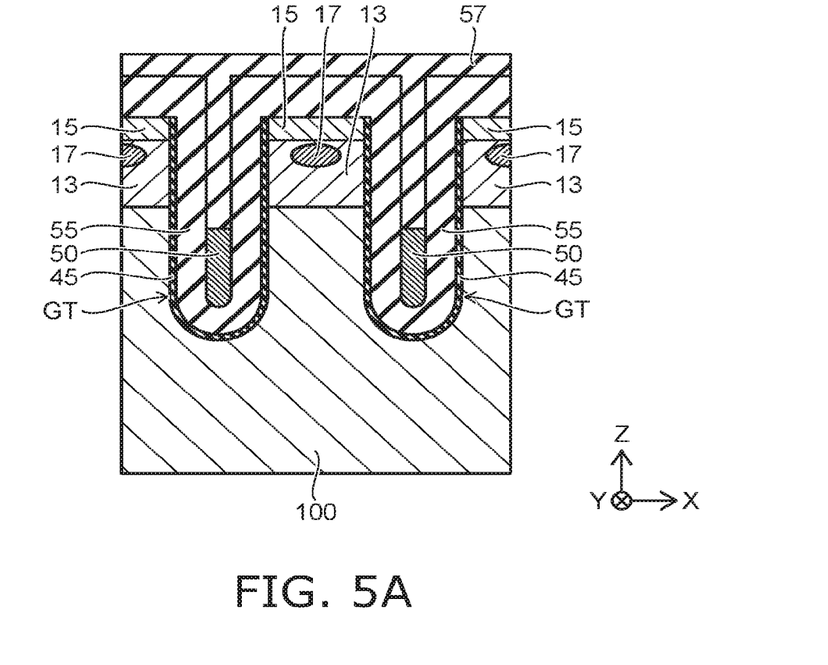

As shown in FIG. 5A, an insulating film 57 is formed to fill the space inside the gate trench GT. The insulating film 57 is formed using, for example, CVD. The insulating film 57 includes the same material as the material of the insulating film 55.

Figure 5B:
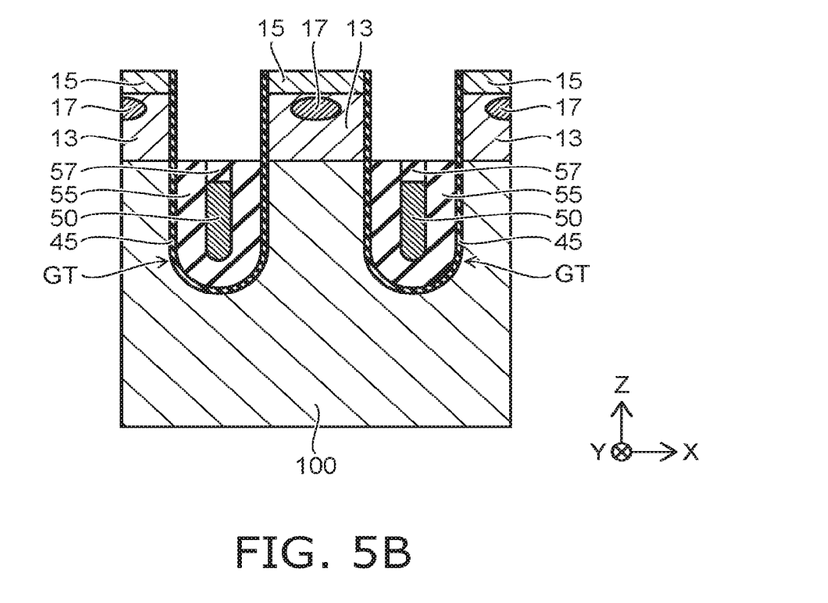

As shown in FIG. 5B, the insulating film 55 and the insulating film 57 are etched back so that a portion of the insulating film 55 and a portion of the insulating film 57 remain in the lower portion of the gate trench GT. Further, the etching back of the insulating films 55 and 57 is performed under the condition where the insulating film 45 is not etched back.

The insulating film 55 and the insulating film 57 that remain inside the gate trench GT are formed so that, in the Z direction, the top surfaces of the insulating films 55 and 57 are positioned at a level same as or deeper than the level at which the bottom of the p-type diffusion layer 13 is positioned. Although the insulating film 57 does not necessarily include the same material as the material of the insulating film 55, it is preferable for the material of the insulating film 57 to have the same etching rate as the etching rate of the insulating film 55 when the insulating films 55 and 57 are etched back. For example, the top surfaces of the insulating films 55 and 57 are formed so as not to have a step at the boundary thereof. The top surfaces of the insulating films 55 and 57 are formed so as to be continuous surfaces.

Figure 6A:
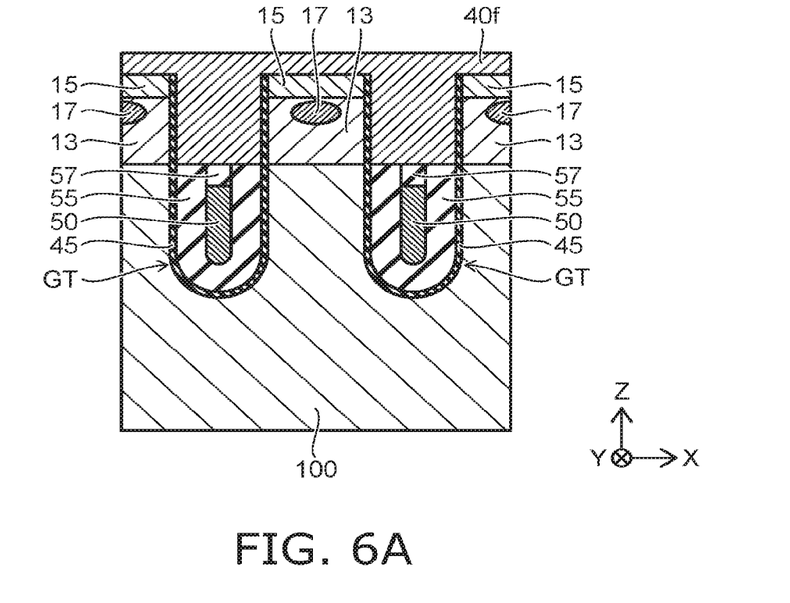

As shown in FIG. 6A, the conductive film 40*f* is formed to fill the space inside the gate trench GT. The conductive film 40*f* is, for example, a conductive poly-silicon film which is formed using CVD.

Figure 6B:
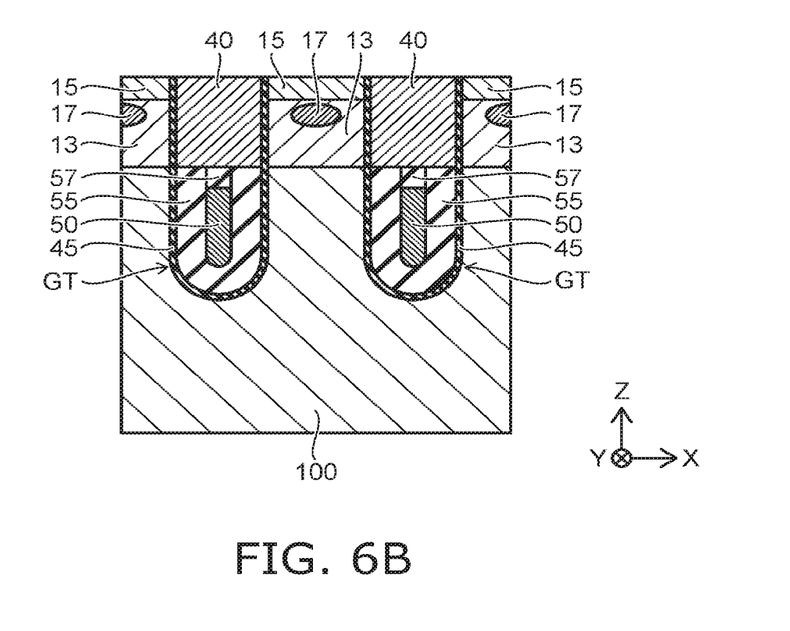

As shown in FIG. 6B, the gate electrode 40 is formed in the upper portion of the gate trench GT. The gate electrode 40 is formed, for example, by etching back the conductive film 40*f* so that a portion of the conductive film 40 remains in the upper portion of the gate trench GT. The gate electrode 40 is formed to face p-type diffusion layer 13 with the insulating film 45 interposed.

Figure 7A:
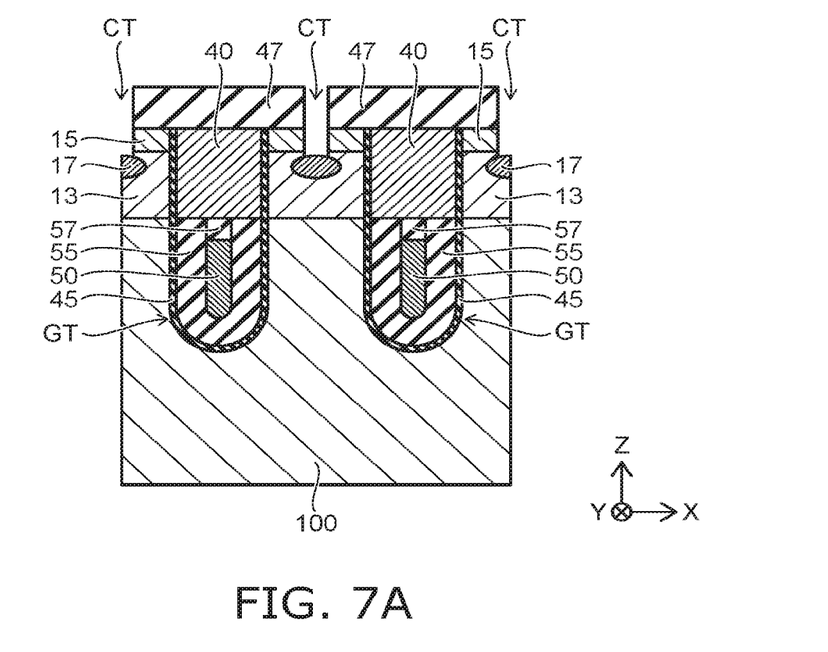

As shown in FIG. 7A, an interlayer insulating film 47 is formed to cover the gate electrode 40. The interlayer insulating film 47 is, for example, a silicon oxide film formed using CVD. Subsequently, a contact trench CT is formed from the top surface of the interlayer insulating film 47 so as to have a depth capable of reaching the p-type contact layer 17.

Figure 7B:
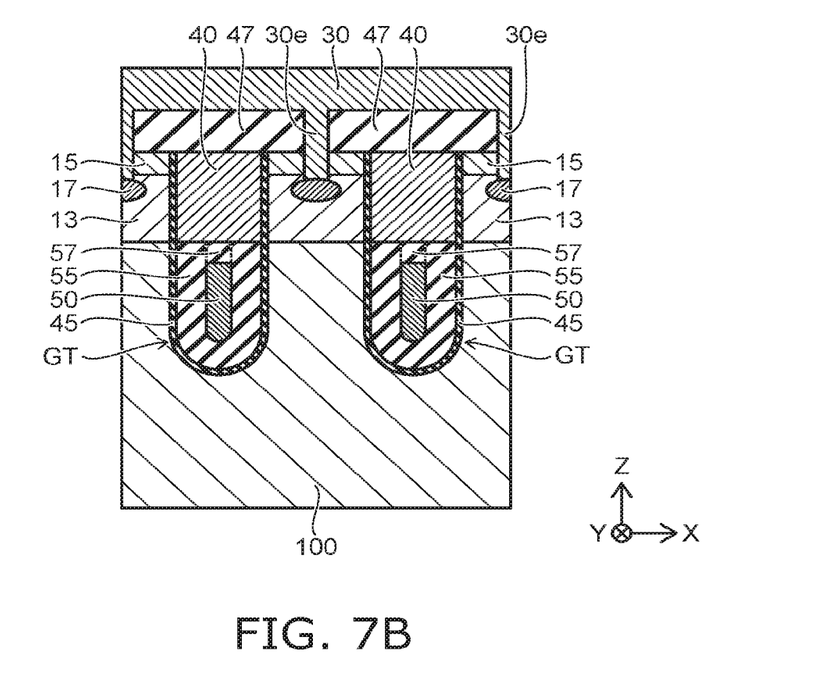

As shown in FIG. 7B, the source electrode 30 is formed on the interlayer insulating film 47. The source electrode 30 is formed using, for example, vacuum evaporation or CVD. The source electrode 30 is formed so as to have a contact portion 30*e* extending into the contact trench CT. The contact portion 30*e* is formed to be in contact with the n-type source layer 15 and the p-type contact layer 17.

The source electrode 30 includes, for example, aluminum. Moreover, the source electrode 30 may have a two-layer structure that includes tungsten embedded in the contact trench CT and aluminum formed thereon.

Subsequently, the silicon wafer 100 is etched or polished on the back surface side to reduce the thickness thereof. The wafer 100 is thinned to be a predetermined thickness. Further, the n-type drain layer 19 (see FIG. 1) is formed by ion-implanting n-type impurities into the silicon wafer 100 on the back surface side. The n-type impurities ion-implanted into the silicon wafer 100 on the back surface side are activated using a method such as laser annealing. Thereby, it is possible to form the n-type drain layer 19 without the thermal deterioration of the insulating film 55 on the front surface side. Instead of the silicon wafer 100, an epitaxial wafer may be used, which includes an n-type silicon wafer with a high impurity concentration and an n-type silicon layer formed thereon with a lower impurity concentration.

Subsequently, the drain electrode 20 (see FIG. 1) is formed on the n-type drain layer 19 (i.e., on the back surface of the silicon wafer 100) to complete the semiconductor device 1. The drain electrode 20 is formed using, for example, a vacuum evaporation and includes a material such as gold germanium alloy (AuGe).

In the manufacturing method according to the embodiment, the insulating film 55 is formed after the processes such as the thermal oxidation and the activation of ion-implanted impurities, which are performed with the heat treatment at not lower than 900 degrees Celsius. After the insulating film 55 is formed, the processes are performed under the lower temperature, such as CVD performed at about 400 degrees Celsius. Thereby, in the manufacturing process of the semiconductor device 1, it is possible to prevent the insulating film 55 from the thermal deterioration.

Figure 8:
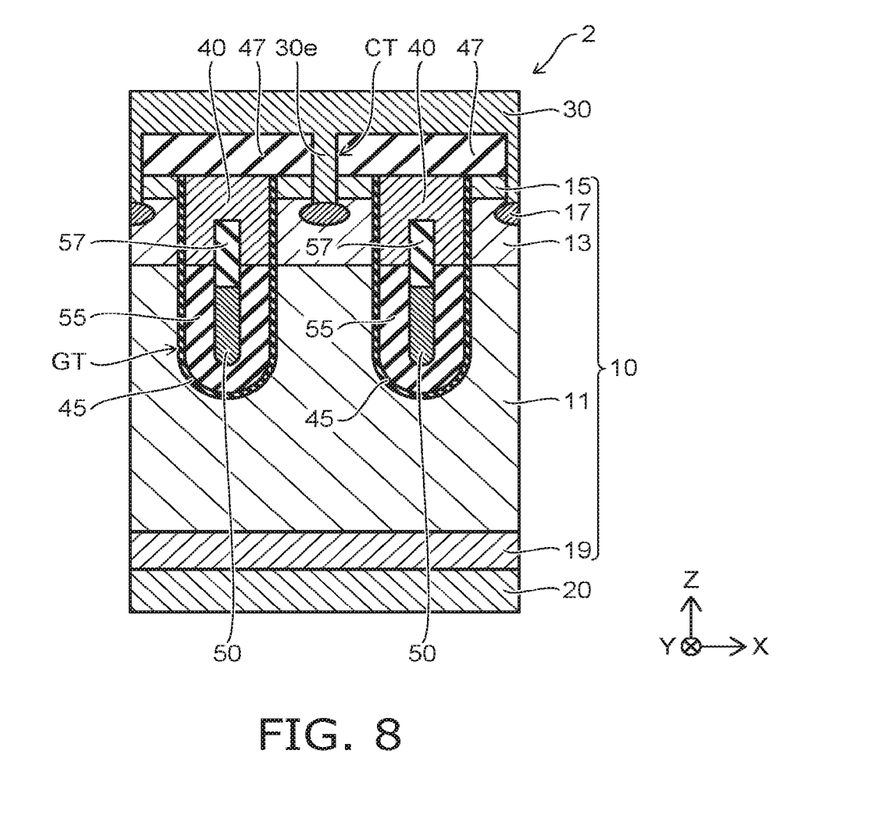
FIG. 8 is a schematic cross-sectional view showing a semiconductor device according to a variation of the embodiment.

FIG. 8 is a schematic cross-sectional view showing a semiconductor device 2 according to a variation of the embodiment. In the semiconductor device 2, the insulating film 57 is provided so as to extend into the gate electrode 40. The top end of the insulating film 57 is located at a level higher in the Z direction than the level at which the bottom of the gate electrode 40 is located. Moreover, the top end of the insulating film 57 is located at the level higher in the Z direction than the level at which the bottom of the p-type diffusion layer 13 is located.

In the example, the insulating film 57 includes a material that has an etching rate slower than the etching rate of the insulating film 55. Thus, in the process shown in FIG. 5B, the insulating film 57 remains with a shape protruding from the top surface of the insulating film 55. Such a structure can also be formed by selectively etching back the insulating film 57, and then, by etching back the insulating film 55. The insulating film may include a material same as the material of the insulating film 45.

In the semiconductor device 2, the parasitic capacitance between the gate and source electrodes can be reduced by increasing the thickness in the Z direction of the insulating film 57 that remains in the gate trench GT.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device comprising:
a semiconductor part including a first semiconductor layer of a first conductivity type;
a first electrode provided on a back surface of the semiconductor part;
a second electrode provided on a front surface of the semiconductor part;
a control electrode provided between the second electrode and the semiconductor part, the control electrode being disposed inside a trench provided on the front surface side of the semiconductor part, the control electrode being electrically isolated from the semiconductor part by a first insulating film; and
a field plate provided inside the trench, the field plate being located between the first electrode and the control electrode, the field plate being electrically isolated from the semiconductor part by the first insulating film and a second insulating film, the field plate being electrically isolated from the control electrode by a third insulating film,
the semiconductor part further including a second semiconductor layer of a second conductivity type and a third semiconductor layer of the first conductivity type,
the second semiconductor layer being provided between the first semiconductor layer and the second electrode, the second semiconductor layer facing the control electrode with the first insulating film interposed, the third semiconductor layer being selectively provided between the second semiconductor layer and the second electrode, the first insulating film including a portion positioned between the first semiconductor layer and the second insulating film, the second insulating film being positioned between the first insulating film and the field plate, the second insulating film having a dielectric constant smaller than a dielectric constant of the first insulating film.

2. The device according to claim 1, wherein the second insulating film has an atomic density lower than an atomic density in the first insulating film.

3. The device according to claim 1, wherein the third insulating film includes a material same as a material of the second insulating film.

4. The device according to claim 1, wherein the field plate is positioned in the first semiconductor layer, and is electrically isolated from the first semiconductor layer by the first insulating film and the second insulating film.

5. The device according to claim 1, wherein the first insulating film includes silicon oxide; and the second insulating film includes silicon oxycarbide.

6. The device according to claim 5, wherein the third insulating film includes silicon oxycarbide.

7. The device according to claim 1, wherein the second insulating film has a first end contacting the control electrode; the third insulating film has a second end contacting the control electrode; and the first end and the second end are arranged along a bottom of the control electrode.

8. The device according to claim 1, wherein the third insulating film extends in a first direction into the control electrode, the first direction being directed from the first electrode to the second electrode.

9. The device according to claim 8, wherein the third insulating film includes a material same as a material of the first insulating film.

10. The device according to claim 8, wherein the first insulating film and the third insulating film each include silicon oxide; and the second insulating film includes silicon oxycarbide.

11. The device according to claim 1, wherein the third insulating film has a top end positioned at a first level in the first direction; and the first level is higher in the first direction than a second level at which a bottom of the control electrode is positioned.

12. The device according to claim 11, wherein the first level is higher in the first direction than a third level at which a bottom of the second semiconductor layer is positioned.

13. A method for manufacturing a semiconductor device, the method comprising:

forming a trench in a semiconductor wafer, the trench being provided on a front surface side of the semiconductor wafer, the semiconductor wafer including a portion to be a first semiconductor layer of a first conductivity type;

forming a first insulating film over the semiconductor wafer, the first insulating film covering an inner surface of the trench;

forming a second semiconductor layer of a second conductivity type on the portion to be the first semiconductor layer, the second semiconductor layer including second conductivity type impurities introduced in the semiconductor wafer on the front surface side;

forming a third semiconductor layer of the first conductivity type on the second semiconductor layer, the third semiconductor layer including first conductivity type impurities introduced in the semiconductor wafer on the front surface side;

forming a second insulating film on the first insulating film inside the trench, the second insulating film being formed so that a first space remains in the trench, the second insulating film having a dielectric constant smaller than a dielectric constant of the first insulating film;

forming a field plate in the first space in the trench, the field plate facing the first semiconductor layer with the first and second insulating films interposed, the field plate being formed so that a second space remains on the field plate;

forming a third insulating film on the field plate in the second space;

removing a portion of the second insulating film and a portion of the third insulating film to form a third space in the trench; and forming a control electrode in the third space, the control electrode being electrically isolated from the field plate by the third insulating film, the control electrode facing the second semiconductor layer with the first insulating film interposed.

14. The method according to claim 13, wherein the first insulating film is an oxide film formed by thermally oxidizing the semiconductor wafer.

15. The method according to claim 13, wherein the second insulating film is formed after the first insulating film, the second semiconductor layer and the third semiconductor layer are formed.

* * * * *